(12) United States Patent
Khakifirooz et al.

(10) Patent No.: US 9,576,960 B2
(45) Date of Patent: Feb. 21, 2017

(54) STRUCTURE FOR FINFET CMOS

(71) Applicant: International Business Machines Corporation, Armonk, NY (US)

(72) Inventors: Ali Khakifirooz, Los Altos, CA (US); Kangguo Cheng, Schenectady, NY (US); Alexander Reznicek, Troy, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/693,918

(22) Filed: Apr. 23, 2015

(65) Prior Publication Data

US 2015/0228654 A1    Aug. 13, 2015

Related U.S. Application Data

(62) Division of application No. 13/848,203, filed on Mar. 21, 2013, now Pat. No. 9,087,724.

(51) Int. Cl.
| | |
|---|---|
| *H01L 27/092* | (2006.01) |
| *H01L 21/8238* | (2006.01) |
| *H01L 21/84* | (2006.01) |
| *H01L 27/12* | (2006.01) |
| *H01L 29/167* | (2006.01) |

(52) U.S. Cl.
CPC ... *H01L 27/0924* (2013.01); *H01L 21/823821* (2013.01); *H01L 21/845* (2013.01); *H01L 27/1211* (2013.01); *H01L 29/167* (2013.01)

(58) Field of Classification Search
CPC ............. H01L 29/785; H01L 29/66795; H01L 29/41791; H01L 21/845; H01L 29/167; H01L 21/1211; H01L 21/823821
See application file for complete search history.

(56) References Cited

U.S. PATENT DOCUMENTS

| | | | |
|---|---|---|---|
| 5,804,482 A | 9/1998 | Konstantinov et al. | |
| 7,250,351 B2 | 7/2007 | Furukawa et al. | |
| 2006/0071275 A1* | 4/2006 | Brask | H01L 21/845 257/350 |
| 2009/0149010 A1 | 6/2009 | Zhu et al. | |
| 2010/0308381 A1 | 12/2010 | Luning et al. | |
| 2011/0049630 A1 | 3/2011 | Majumdar et al. | |

(Continued)

OTHER PUBLICATIONS

Mizushima, "Selective Epitaxy of Si and SiGe for Future MOS Devices", ECS Transactions, vol. 22, No. 1, 2009, pp. 81-90.

(Continued)

*Primary Examiner* — Minh-Loan Tran
*Assistant Examiner* — Farid Khan
(74) *Attorney, Agent, or Firm* — Andrew G. Wakim (57) ABSTRACT

According to an embodiment, the invention provides an nFET/pFET pair of finFETs formed on a gate stack. At least one fin extends into a source drain region of each of the FET pair and a carbon doped silicon (Si:C) layer is formed on each such fin. Another aspect of the invention is a process flow to enable dual in-situ doped epitaxy to fill the nFET and pFET source drain with different epi materials while avoiding a ridge in the hard cap on the gate between the pair of finFETS. The gate spacer in both of the pair can be the same thickness. The extension region of both of the pair of finFETs can be activated by a single anneal.

12 Claims, 10 Drawing Sheets

(56) References Cited

U.S. PATENT DOCUMENTS

| | | | |
|---|---|---|---|
| 2011/0068407 A1* | 3/2011 | Yeh | H01L 21/823807 257/369 |
| 2011/0151652 A1* | 6/2011 | Sssaki | H01J 37/32412 438/513 |
| 2011/0193141 A1* | 8/2011 | Lin | H01L 29/045 257/255 |
| 2011/0201164 A1 | 8/2011 | Chung et al. | |
| 2011/0210393 A1 | 9/2011 | Chen et al. | |
| 2011/0248348 A1* | 10/2011 | Gan | H01L 29/66795 257/369 |
| 2011/0291188 A1* | 12/2011 | Cheng | H01L 29/785 257/347 |
| 2011/0309333 A1 | 12/2011 | Cheng et al. | |
| 2013/0168771 A1* | 7/2013 | Wu | H01L 27/1211 257/351 |
| 2013/0334614 A1 | 12/2013 | Liaw | |
| 2013/0341722 A1 | 12/2013 | Illgen et al. | |
| 2014/0038369 A1 | 2/2014 | Adam et al. | |
| 2014/0120678 A1* | 5/2014 | Shinriki | H01L 29/66795 438/283 |
| 2014/0167120 A1* | 6/2014 | Chi | H01L 27/0886 257/288 |
| 2014/0284719 A1 | 9/2014 | Khakifirooz et al. | |

OTHER PUBLICATIONS

Cheng et al., "Extremely Thin SOI (ETSOI) CMOS with Record Low Variability for Low Power System-on-Chip Applications", 2009 IEEE International Electron Devices Meeting (IEDM), Dec. 7-9, 2009, pp. 3.2.1-3.2.4.

* cited by examiner

STRUCTURE FOR FINFET CMOS

CROSS-REFERENCE

The present application is a divisional of, and claims priority under 35 U.S.C. §120, U.S. patent application Ser. No. 13/848,203, filed on Mar. 21, 2013, which is incorporated by reference in its entirety.

BACKGROUND

The subject matter disclosed herein relates to semiconductor structures. More specifically, the subject matter disclosed herein relates to forming complimentary field effect transistors of the fin type.

A finFET refers to a fin-type field effect transistor. More specifically, a finFET includes at least a "fin" of semiconductor material formed on a substrate such that the fin sidewall planes are orthogonal to the plane of the substrate, a gate electrode disposed on the substrate and extending over and generally perpendicular to the at least one fin, and a source drain region one either side of the gate electrode. The at least one fins typically extend from under the gate into both source drain regions.

The performance of a finFET and other structures based on silicon-on-insulator (SOI) or extremely thin silicon-on-insulator (ETSOI) semiconductor substrates can be improved by forming the source/drain (S/D) regions by in-situ doped epitaxy processing rather than by implant processes.

Figure 1:
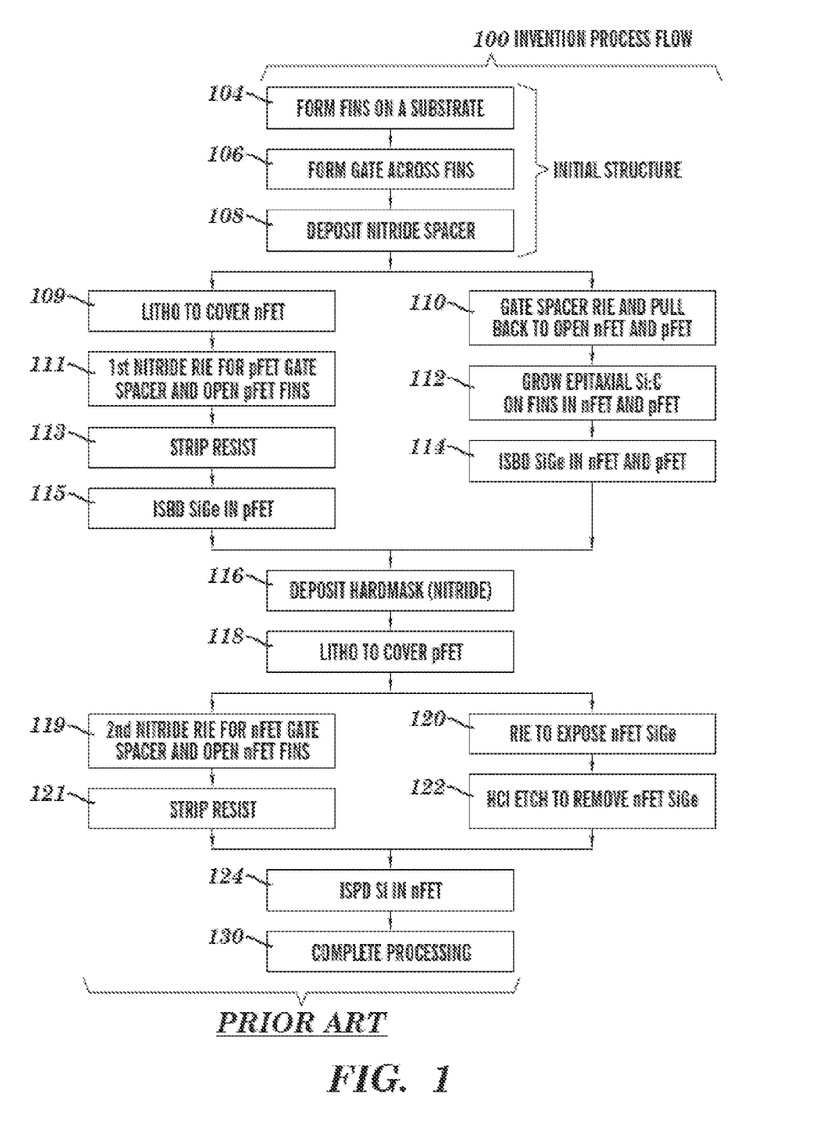
FIG. 1 sets forth steps of a process flow according to the present invention.

However, to impart compressive strain to the pFET channel and tensile strain to the nFET channel, such as by forming in-situ boron doped (ISBD) SiGe for the pFET S/D and in-situ phosphorus doped (ISPD) Si for the nFET S/D requires separate epi steps and that presents a number of challenges. One current flow scheme to form a complimentary pair of finFETs, meaning an n-type and p-type pair of finFETs, is illustrated by the path of FIG. 1 which passes through odd numbered steps. The method is applied to an initial structure that includes fins defined on a substrate (104) and a gate stack is formed across the fins (106). A spacer material such as silicon nitride can be deposited as a conformal layer over the gate and fins. A photoresist layer can be patterned (109) to form a soft mask cover over the nFET region and expose the pFET region. (Although this example forms the pFET first, the order can be switched to form the nFET first.) A first directional etch (111), such as nitride RIE, to remove the exposed spacer layer (of 108) from the pFET S/D region exposes the pFET fins and forms the pFET gate spacer. After stripping (113) the soft mask, the pFET S/D can be formed (115) by epitaxial ISBD SiGe growth from the exposed pFET fins. The pFET can then be covered by depositing (116) a hard mask material, such as a second silicon nitride layer. A second photoresist layer can be patterned (118) to form a second soft mask covering the pFET region and exposing the nFET region which at this point includes the layer of step 108 and the layer of step 116. A second etch (119), such as nitride RIE, can remove both layers from the nFET S/D region to expose the nFET fins and forms the nFET gate spacer. After stripping (121) the second soft mask, the nFET S/D can be formed (124) by epitaxial ISPD Si growth from the exposed nFET fins.

However, the dual in-situ doped epitaxy flow described above leads to several problems. For example, the gate spacer in the second to be formed FET is formed from two hard mask layers which may result in that second-formed gate spacer being thicker than the gate spacer of the first formed FET (which is formed from just one hard mask layer). Another problem is that the drive-in anneal to activate the extension requires higher temperature for the pFET than for the nFET. Extension refers to the semiconductor region between source/drain and channel region. In the finFET structure, the extension can include the portion of a fin that is under the gate spacer.

Accordingly, the first formed FET must undergo both anneals which broadens the dopant front at the extension junction which is deleterious to short-channel control. Yet another problem is that the overlay of the first (109) and second (118) lithography can leave a double thickness ridge of hard mask (e.g., spacer) material over the gate at the transition between an adjacent nFET and pFET pair.

SUMMARY

Various embodiments disclosed include methods of forming semiconductor structures. In one embodiment, a method includes:

According to a first embodiment, the invention provides a structure that includes a gate stack disposed over a plurality of fins on a integrated circuit substrate. On a first portion of the gate stack is an nFET that includes a first subset of said plurality, a source drain region on both sides of said first portion, and at least one fin of the first subset extends laterally from said first portion into said nFET source drain region. On a second portion of the gate stack and adjacent to the nFET is a pFET that includes a second subset of the plurality of fins, a source drain region on both sides of said second portion, and at least one fin of said second subset extends laterally from said second portion into said pFET source drain region. A carbon doped silicon (Si:C) layer is formed on the at least one fin in the pFET S/D and also on the at least one fin in the nFET S/D. The nFET S/D can be filled with a material to impose tensile strain such as in-situ phosphorous doped silicon and the pFET S/D can be filled with a material to impose compressive strain such as in-situ boron doped SiGe. The gate spacer of the nFET can be the same material and same shape and thickness as the gate spacer of the pFET. The Si:C layer can have a carbon content between 0.2 to 3.0% and the Si:C layer can be between 1 nm and 3 nm thick.

Another embodiment of the present invention is a structure comprising an n-type and a p-type pair of finFETs in an integrated circuit wherein each finFET of said pair includes a gate electrode disposed over a set of fins, the structure further comprising a first gate spacer in said n-type finFET and a second gate spacer in said p-type finFET, where the thickness at the base of said first gate spacer is the same as the thickness at the base of said second gate spacer. The pair of finFETs can be formed adjacent to each other on the same continuous gate stack. The maximum thickness of a hard cap on the gate between such adjacent pair of finFETs can be the same as (i.e., not greater than) the maximum thickness of a hard cap on the gate of either such adjacent pair of finFETs.

According to a third embodiment, the present invention provides a method to form a complimentary pair of finFETs. The method includes (a) forming a spacer on a gate stack disposed over a plurality of fins, wherein such gate stack extends through a n-type finFET and a p-type finFET, and wherein at least two fins extend into a source drain region on one side of said gate stack and forming a carbon-doped silicon layer on said at least two fins within said source drain region. The method can include growing in-situ phosphorous doped silicon on at least one of the at least two fins.

BRIEF DESCRIPTION OF THE SEVERAL VIEWS OF THE DRAWINGS

The following detailed description, given by way of example and not intended to limit the invention solely thereto, will best be appreciated in conjunction with the accompanying drawings, in which:

These and other features of this invention will be more readily understood from the following detailed description of the various aspects of the invention taken in conjunction with the accompanying drawings that depict various embodiments of the invention, in which:

FIG. 1 also presents steps of a current process flow for ease of comparison.

The drawings are not necessarily to scale. The drawings are merely schematic representations, not intended to portray specific parameters of the invention. The drawings are intended to depict only typical embodiments of the invention. In the drawings, like numbering represents like elements.

DETAILED DESCRIPTION

The present disclosure relates to forming complimentary paired finFETs in integrated circuits. As described herein, 'complimentary paired finFETs' means to a structure that includes two finFETs (fin-type field effect transistors) formed by complimentary metal on semiconductor (CMOS) processing, one being a n-type finFET in which the source drain regions are doped to increase electron mobility and the other being a pFET in which the source drain regions are doped to increase hole mobility. It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

FinFET performance can be improved by forming the S/D by in-situ doped epitaxy, but a drawback of conventional approaches to form paired CMOS finFETS with in-situ doped S/D regions is that the conventional process involves two lithography steps which can leave a ridge on the gate stack between the nFET/pFET pair. Another drawback is that the gate spacer in the second to be formed of the finFET pair is wider than that of the first to be formed of the finFET pair.

The inventors have conceived of a process flow to form paired CMOS finFETs, which process flow overcomes the foregoing problems. The process can best be described with reference to the flow path 100 (through the even numbered steps) described in FIG. 1 and the structures depicted in FIGS. 2-11.

Figure 2:
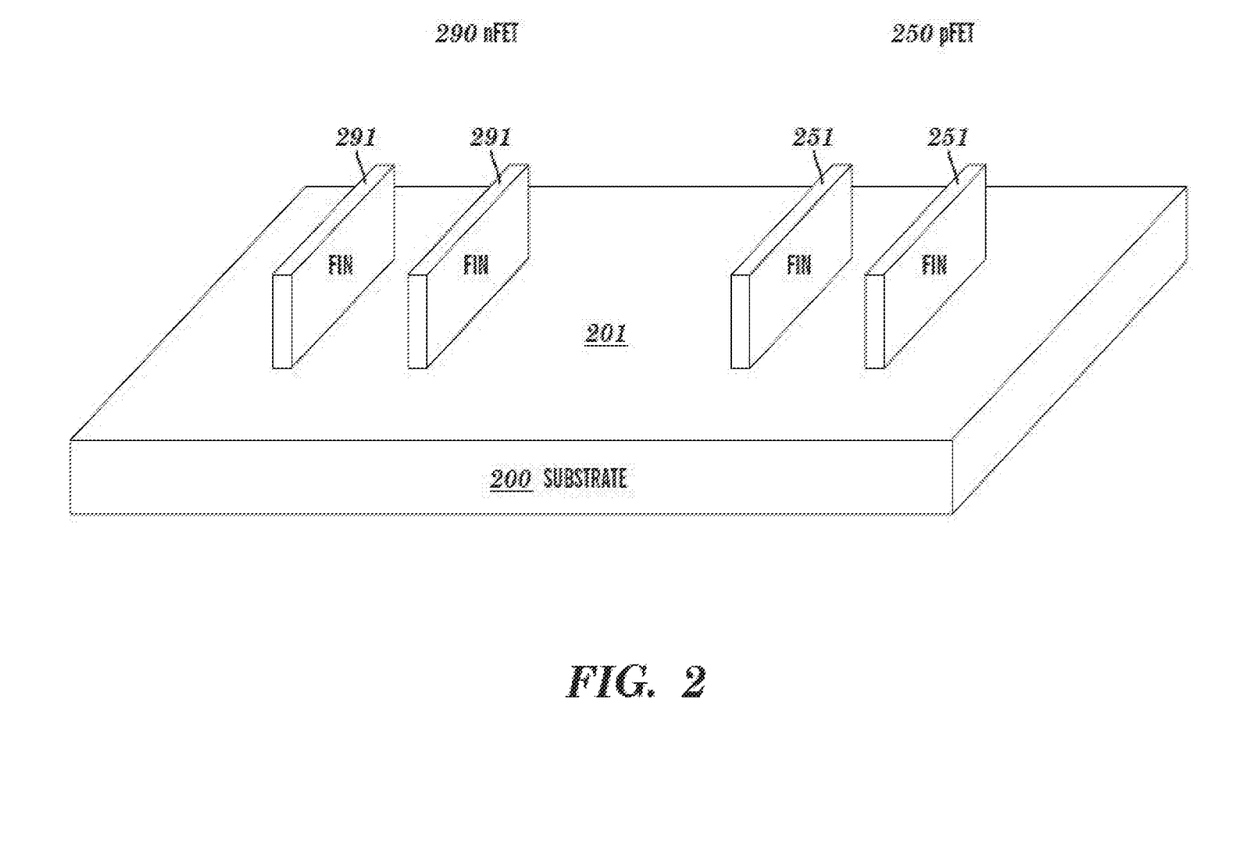
FIGS. 2-4 illustrate forming an initial structure appropriate for processing according to the process flow of the present invention.

FIG. 2 depicts a starting structure which includes a plurality of fins formed on a substrate 200. The structure of FIG. 2 can be formed as the first step 104 of a method embodiment of the present invention. Substrate 200 can be a semiconductor wafer or a part thereof, such as the substrate of a single integrated circuit chip. Substrate 200 can be a bulk wafer formed of any conventional semiconductor substrate material including but are not limited to silicon, germanium, silicon germanium, silicon carbide, and those consisting essentially of one or more III-V compound semiconductors having a composition defined by the formula $Al_{X1}Ga_{X2}In_{X3}As_{Y1}P_{Y2}N_{Y3}Sb_{Y4}$, where X1, X2, X3, Y1, Y2, Y3, and Y4 represent relative proportions, each greater than or equal to zero and together summing to 1. Other suitable substrates include II-VI compound semiconductors having a composition $Zn_{A1}Cd_{A2}Se_{B1}Te_{B2}$, where A1, A2, B1, and B2 are relative proportions each greater than or equal to zero and sum to 1. Furthermore, a portion of or the entirety of substrate 200 can be strained.

Substrate 200 preferably includes an oxide layer (not show) on the surface 201 between the fins. Optionally substrate 200 is a SOI or ETSOI substrate, the fins being formed of the semiconductor layer overlying the oxide insulator layer such that the oxide layer also underlies the fins and separates the fins from the bulk of substrate 200. In the case of substrate 200 being an SOI structure, the fins can be formed by removing the entire top semiconductor layer between adjacent fins, such as by spacer imaging transfer. The insulator layer of such SOI structure can be a conventional oxide material, e.g., silicon dioxide ($SO_2$), or another insulating material. The material of the fins can be silicon, silicon germanium, or any suitable semiconductor.

In embodiments, all of fins can be equally spaced, but the invention is not so limited. A first group of fins 291 can be associated with the nFET region 290 and a second group of fins 251 can be associated with the pFET region 250. FIG. 2 depicts exactly two fins associated with each of the nFET and the pFET, but each finFET can have any number of fins (including just one fin) as long as the gate traverses at least one fin.

Figure 3:
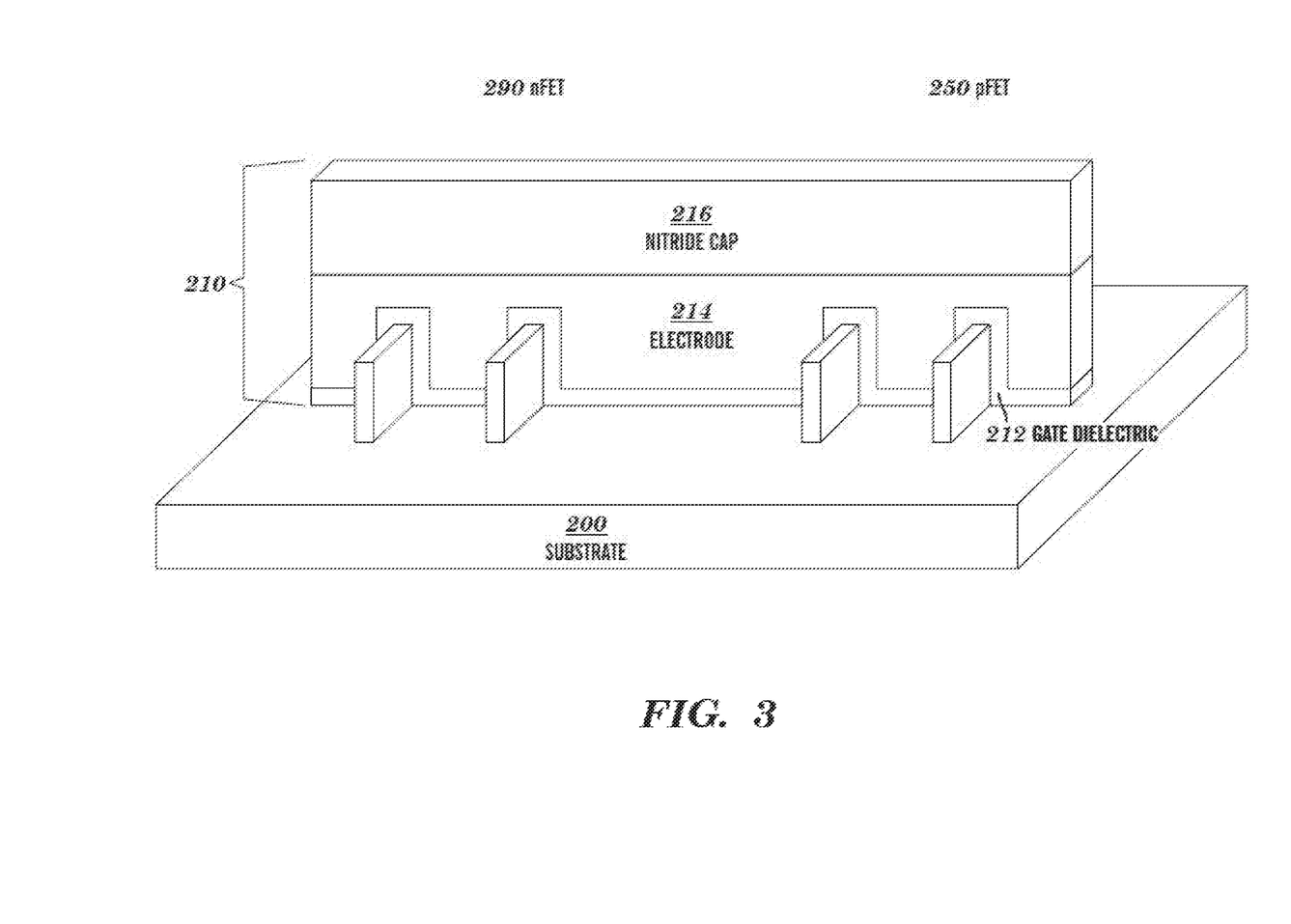

FIG. 3 illustrates a gate stack 210 formed across the fins 291 and continuing across the fins 251. Gate stack 210 includes a gate dielectric 212, a gate electrode 214 and a cap layer 216. The structure of FIG. 3 can be formed as step 106 of process flow 100 and can be formed by conventional processing. In embodiments, gate dielectric can be an insulating material such as silicon oxide, silicon nitride, silicon oxynitride, boron nitride, high-k materials, or any combination of these materials. Examples of high-k materials include but are not limited to metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, and lead scandium tantalum oxide. The high-k may further include dopants such as lanthanum, aluminum, gate electrode 214 can be polysilicon or amorphous silicon, germanium, silicon germanium, a metal (e.g., tungsten, titanium, tantalum, ruthenium, zirconium, cobalt, copper, aluminum, platinum, tin, silver, gold), a conducting metallic compound material (e.g., tantalum nitride, titanium nitride, tungsten silicide, tungsten nitride, ruthenium oxide, cobalt silicide, nickel silicide), carbon nanotube, conductive carbon, or any suitable combination of these materials. The conductive material may further comprise dopants that are incorporated during or after deposition, and cap layer 216 can be a nitride layer such as silicon nitride or oxide, oxynitride.

In step 108 a spacer material can be deposited as a conformal layer covering the gate stack 210, covering the fins to the extent they extend into or through a source drain region on either side of the gate, and also covering the substrate surface 201. The process flow is described for the case of this spacer material being silicon nitride but any material that can form a spacer can be used by appropriate process adjustments such as to the etch chemistries. A directional etch such as reactive ion etch (RIE) applied to the conformal spacer layer can remove the spacer material from all horizontal surfaces and leave a spacer on the sidewalls of the gate as well as on the sidewalls of the fins. If the gate stack is higher than the fins, then continuing the etch can open the fins, that is, a 'pull-down' etch can remove the spacer material from the fin sidewalls while retaining a narrow spacer 220 on the gate as shown in FIG. 4 and corresponding to step 110 in FIG. 1.

Figure 4:
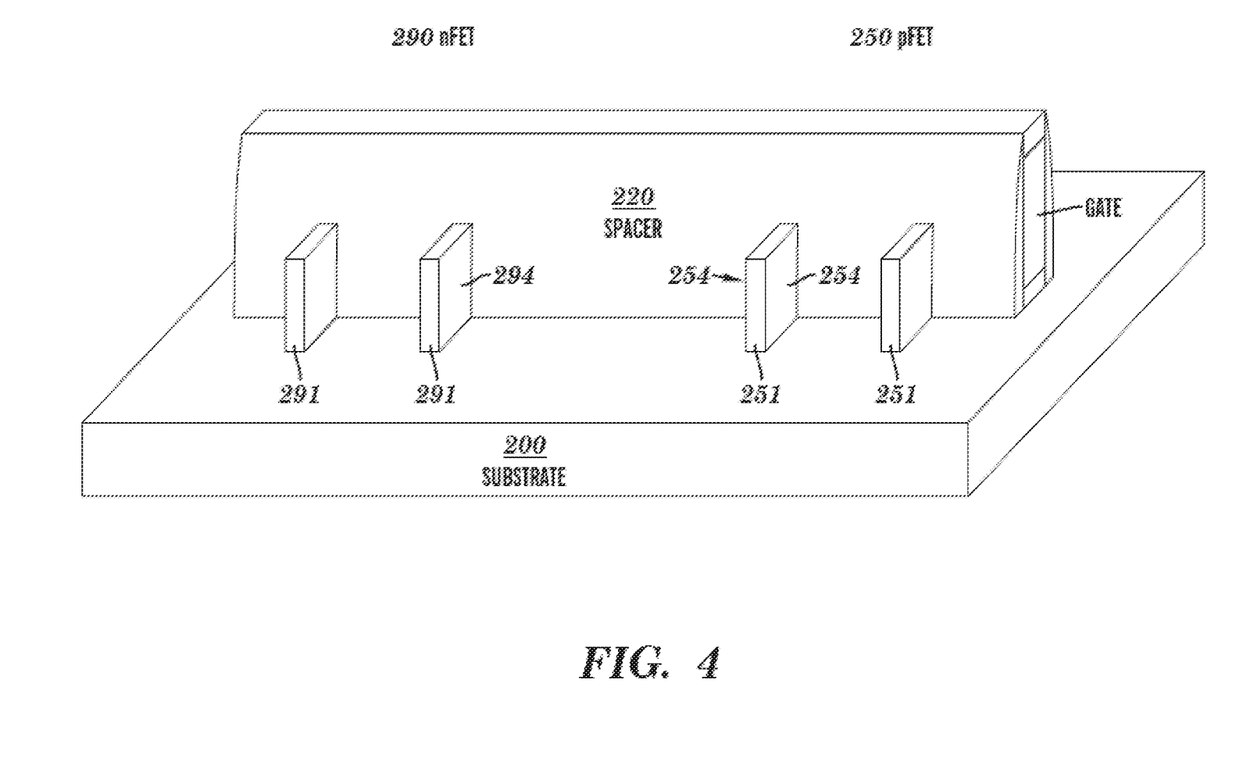
Figure 5:
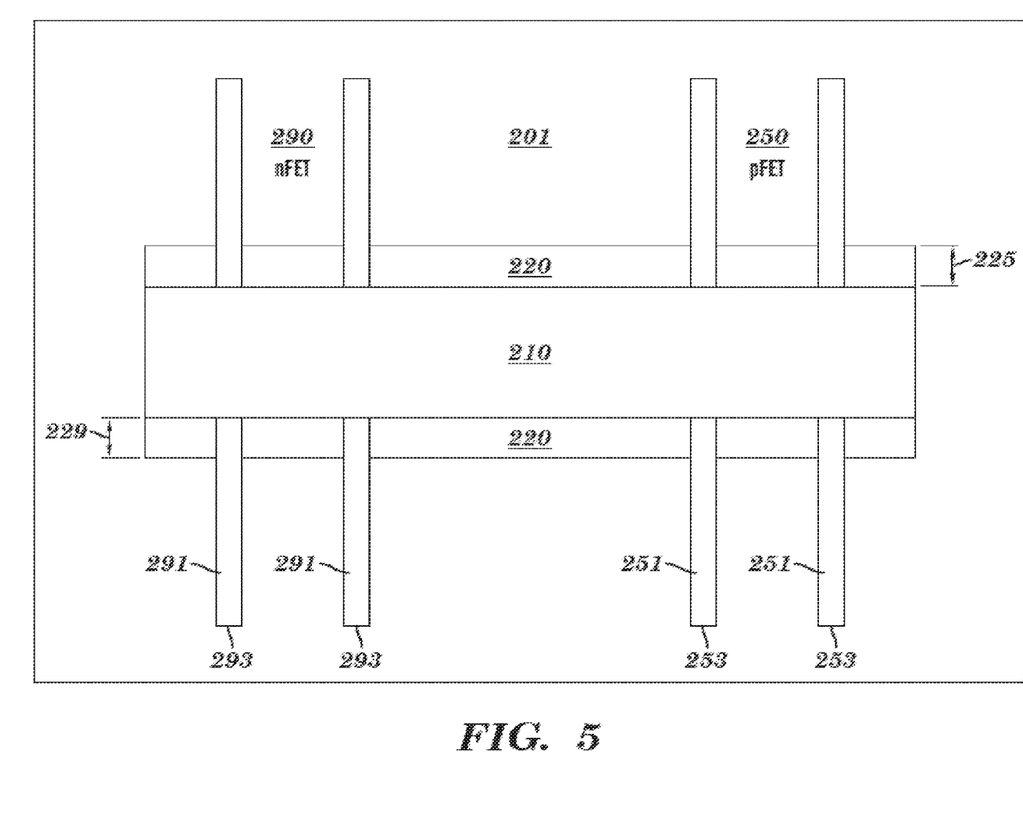
FIG. 5 illustrates the footprint of the structure of FIG. 4 as a top view at the substrate surface.

A top view illustrating the footprint of each element of the structure of FIG. 4 at the substrate surface 201 is provided in FIG. 5. Since the nFET spacer and pFET spacer are formed simultaneously, the nFET spacer thickness 229 is the same as the pFET spacer thickness 225. Note that this view depicts exposed fin ends 253 and 293, but the fins may extend further such that a fin end is not actually exposed.

According to step 112, the next step is to grow a layer of carbon doped silicon (Si:C) on the fins of both the nFET (295) and the pFET (255). The inventors have discovered that such Si:C layer can help to balance the diffusion rates of the different dopants of the FET pair. More specifically, it has been observed that carbon doped silicon can reduce the rate or distance of phosphorus diffusion from an ISPD region. This layer can therefore enable activating both FET extension regions of a CMOS finFET pair with just a single anneal to drive in dopant.

This Si:C layer can be grown in the same chamber used for other epitaxy steps or in a dedicated Si:C epitaxy chamber. Greater carbon content or a thicker Si:C layer can slow phosphorus diffusion without greatly affecting the rate of boron diffusion, so the carbon content and thickness can be tailored as needed. The Si:C layer can be in the range of 1 nm to 10 nm thick and can include carbon in the range of 0.2 to 3.0%. In a preferred embodiment, the Si:C layer is can be quite thin such as in the range of less than 5 nm, or between 1 and 5 nm thick, e.g., 3 nm thick, and can have between 2 and 2.5% carbon. The Si:C layer can be formed by traditional epitaxial processing, or a cyclical process.

One such cyclical process includes a first epitaxial deposition. On exposed semiconductor surfaces, the growth will be single crystalline. Elsewhere, the growth will be amorphous. An etch using only an etchant gas such as chlorine or HCl or Cl2 can preferentially attack the amorphous material. This etch can be timed to leave some crystalline material while removing all the amorphous material. Repeating this sequence can build up a desired thickness of crystalline material.

According to an embodiment, after a sufficient thickness of Si:C is formed, the conditions in the chamber can be adjusted to fill the pFET source drain (256) with material such as boron doped silicon germanium that promotes hole mobility, and simultaneously fill the nFET source drain (257) with the same material. For example if the fin material is silicon, a preferred pFET source drain material can be silicon germanium having germanium content in the range of 5% to 80%, or preferably between 20% and 60%. The optimal germanium content of the SiGe source drain can be selected based on design preferences and in embodiments can be about 40%. In preferred embodiments the source drain filling step 114 can utilize epitaxial growth conditions that promote in-situ boron doped formation of SiGe to merge the source drain regions in both the nFET and pFET regions. The conditions can be tuned to incorporate in the SiGe a boron content in the range of $1 \times 10^{19}$ cm$^{-3}$ to $2 \times 10^{21}$ cm$^{-3}$, or preferably between $2 \times 10^{20}$ cm$^{-3}$ to $7 \times 10^{20}$ cm$^{-3}$.

Figure 6:
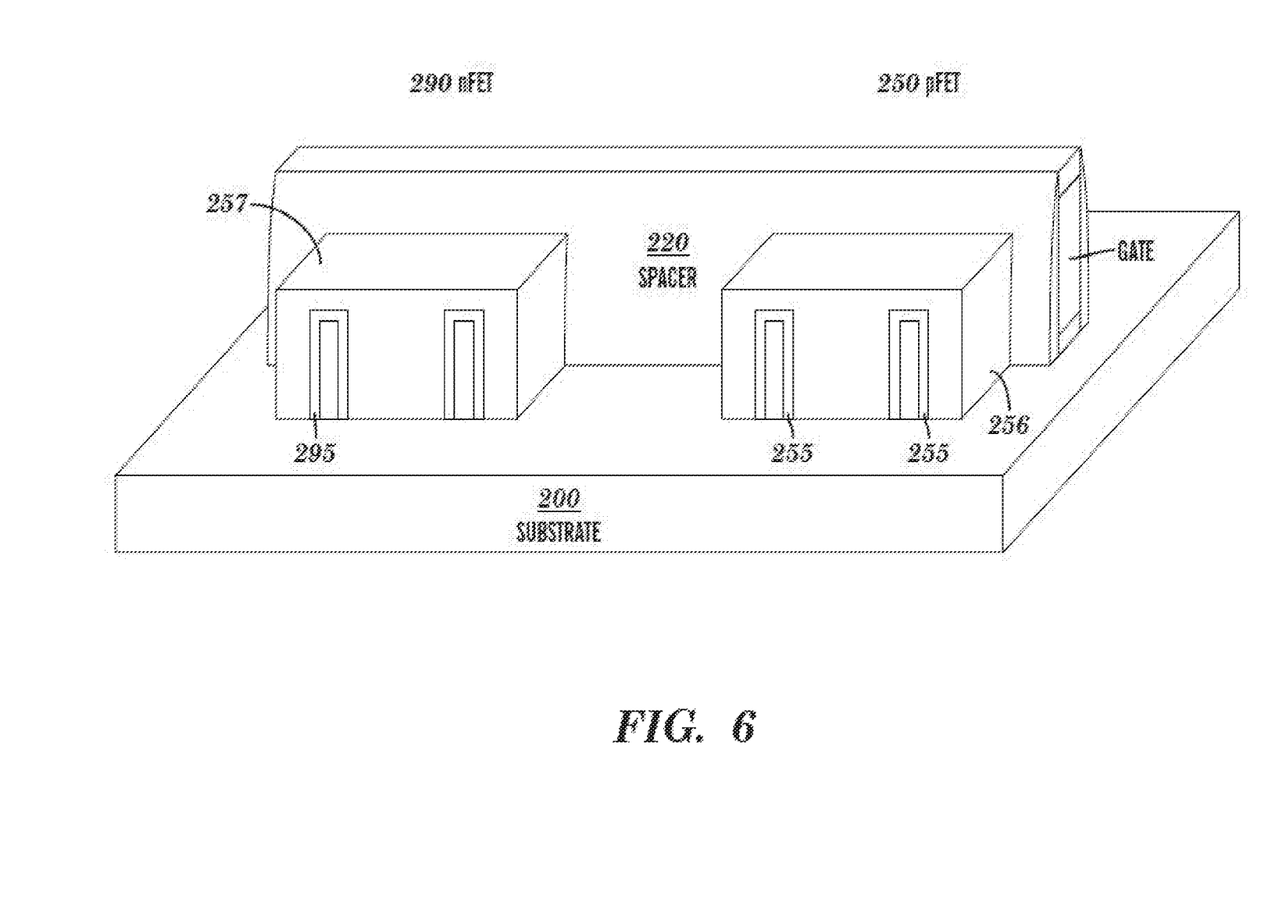
FIG. 6 illustrates a CMOS pair of finFETs at an intermediate processing stage according to the present invention.
Figure 7:
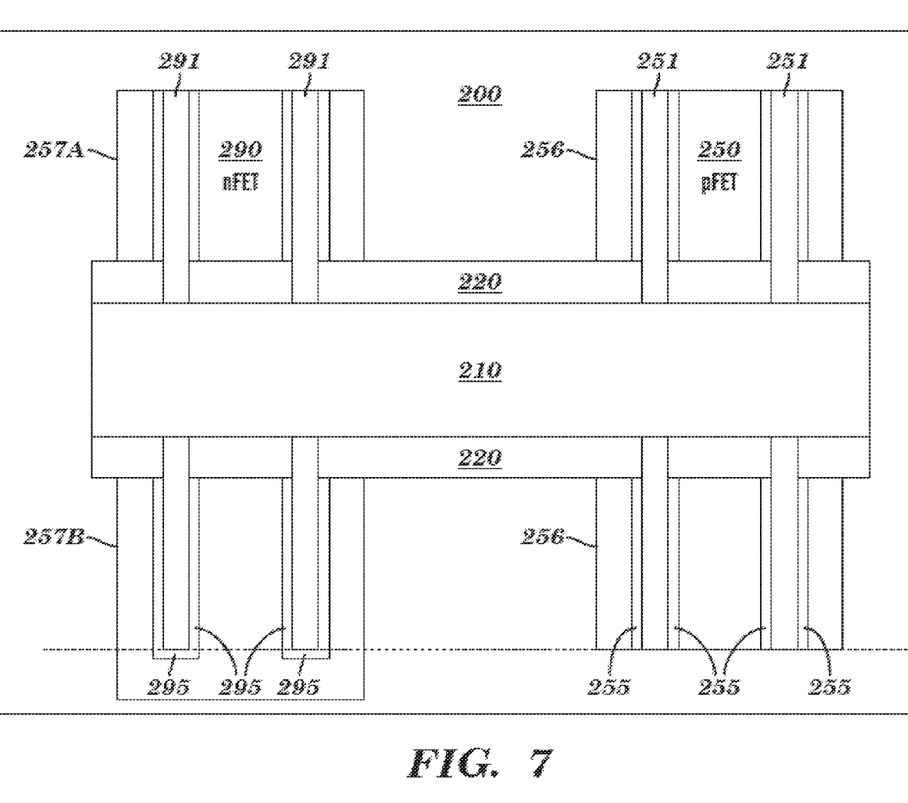
FIG. 7 illustrates the footprint of the structure of FIG. 6 as a top view at the substrate surface according to embodiments of the present invention.
Figure 8:
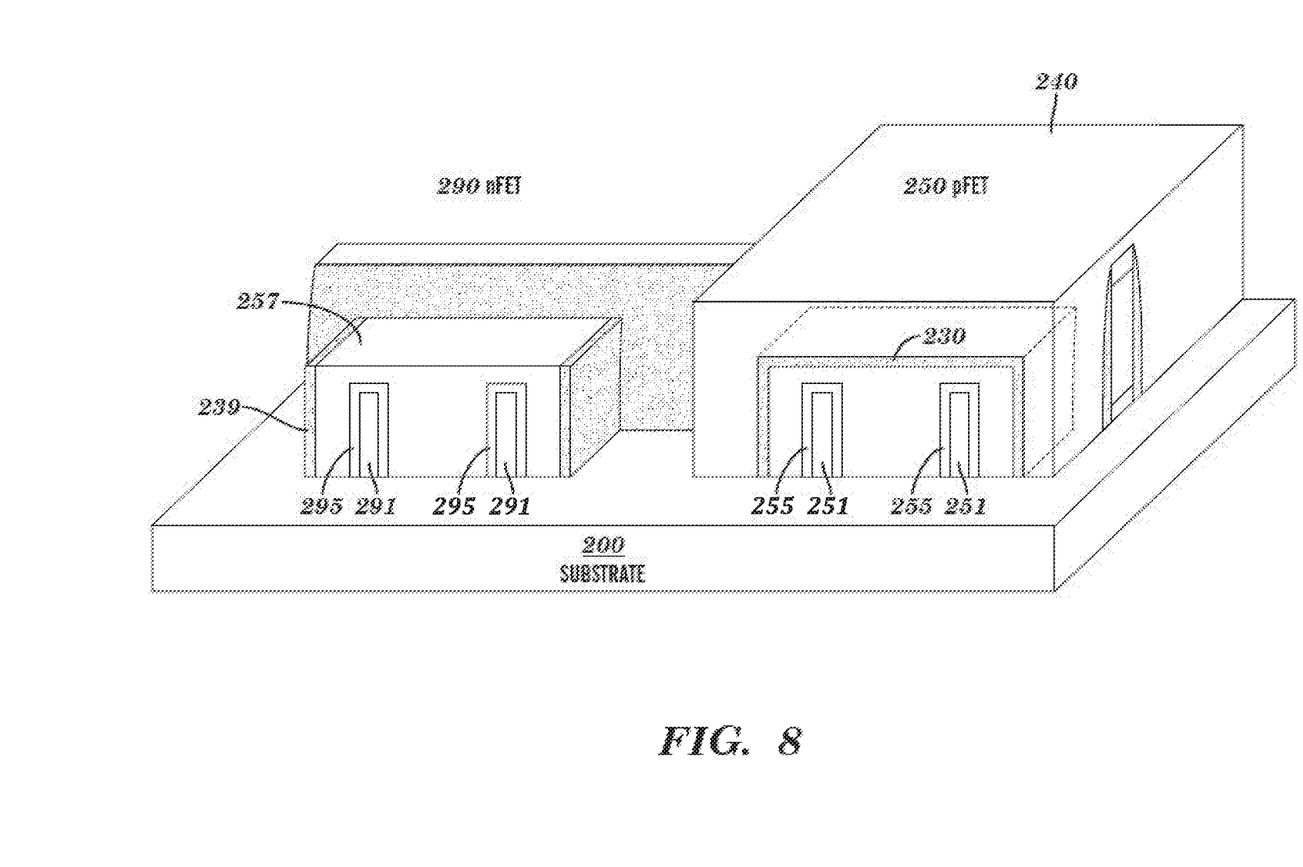
FIGS. 8 and 9 illustrate a CMOS pair of finFETs at further processing steps according to the present invention.

In embodiments the fins can be oriented such that a 110 crystal surface forms the sidewalls 254 and 294 which can promote lateral epitaxial growth. Growth conditions can be tuned to permit the lateral growth faces to meet with minimal vertical growth. FIG. 7 illustrates the various layers on the surface 201 under the filled source drain regions. In the case that fins are cut or in any event do not extend completely through the source drain region, the Si:C layer will form over the fin end as well as over the fin top surface and sidewalls as shown within filled source drain 257B. In the case that fins continue to an adjacent gate such that no fin end is exposed within a source drain region, the Si:C layer will form just over the fin top surface and sidewalls as shown within filled source drain regions 257A and 256. The side view figures, such as FIGS. 6 and 8, depict this latter case from a vertical plane through line AA.

According to step 116 of process flow 100, the next step is to deposit a hard mask 230. The material of layer 230 can be any material appropriate as a hard mask; in the embodiment illustrated in FIG. 8, layer 230 is a thin layer of silicon nitride deposited as a conformal layer. One option is to deposit layer 230 by in-situ radical assisted deposition (iRAD) as described at http://www.thefreelibrary.com/Tokyo+Electron+(TEL)+Introduces+Plasma-Enhanced+Batch+Thermal+CVD . . . -a0133833280. Layer 230 can otherwise be deposited by other known conformal deposition processes such as LPCVD (low-pressure chemical vapor deposition), ALD (atomic layer deposition), etc.

A photoresist layer can be patterned (118) to form a soft mask 240 covering the pFET region 250 and exposing the nFET region 290. A directional etch (120), such as nitride RIE, can remove the exposed horizontal surfaces of layer 230. At this point, the entire pFET region is covered by soft mask 240 and hard mask 230. In the nFET, sidewalls along the sides of the nFET S/D ('sidewalls' referring to those surfaces in the nFET region that are generally perpendicular to the direction of etch 120) are covered by a spacer 239 formed by etch of layer 230, and the top of the nFET S/D, material 257, is exposed.

Figure 9:
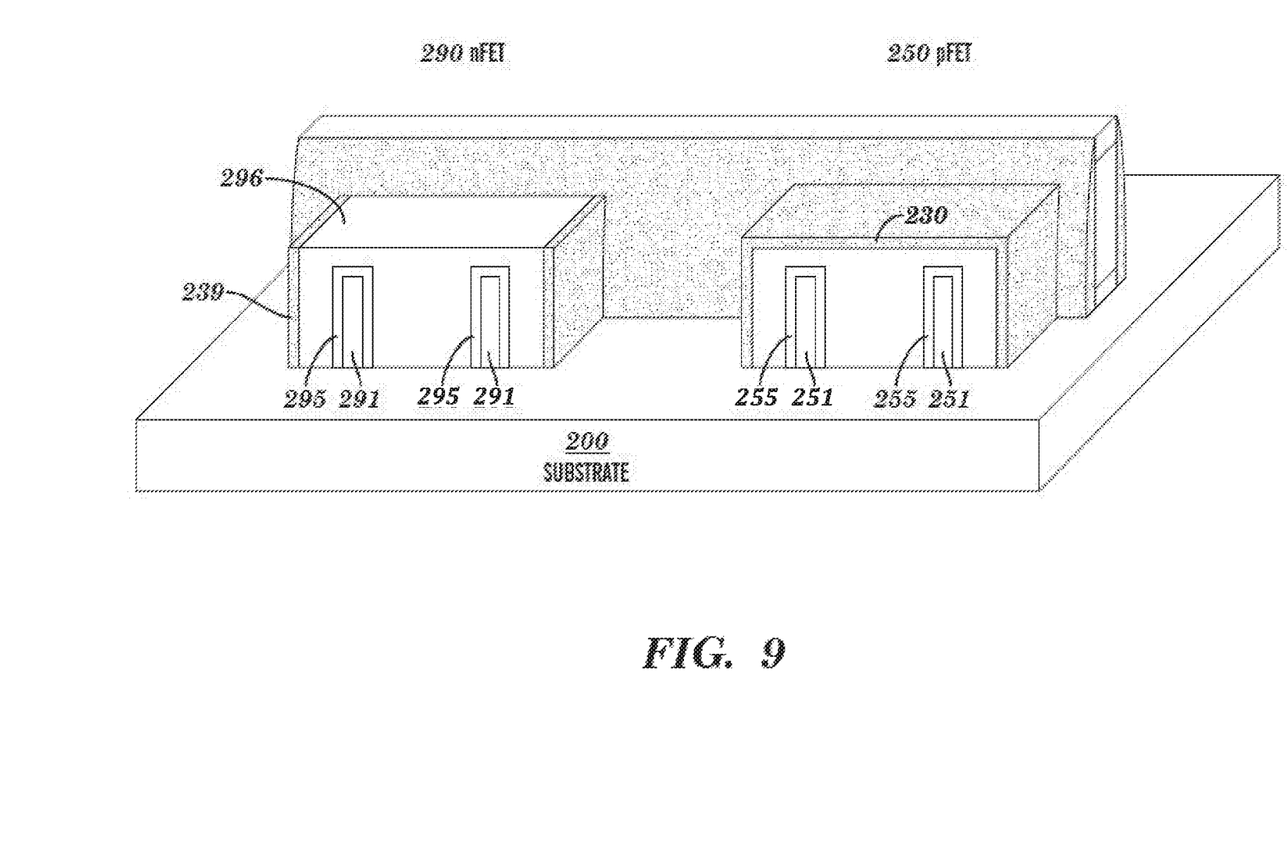
Figure 10:
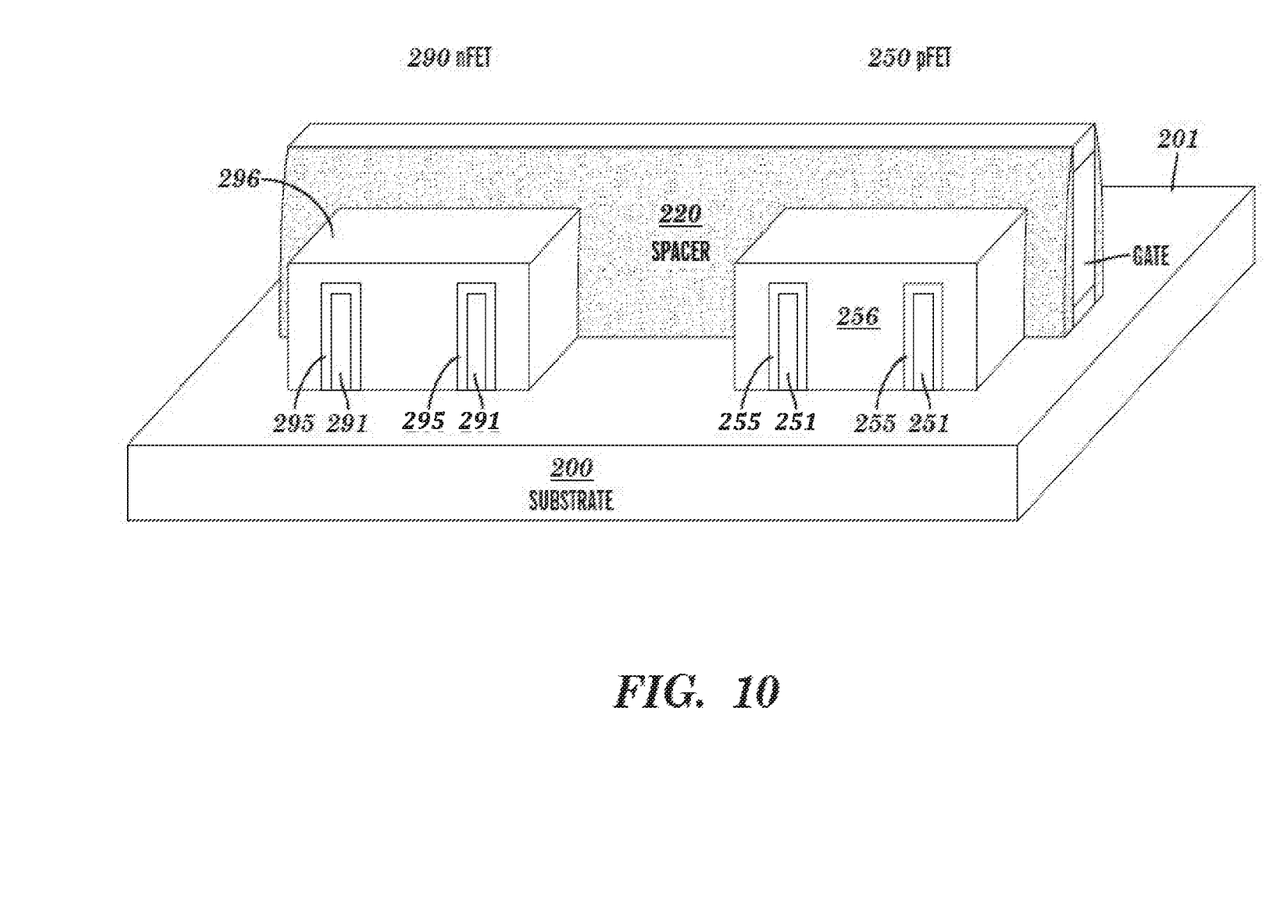
FIG. 10 illustrates a completed CMOS pair of finFETs according to an embodiment of the present invention.

Referring now to FIG. 9, the softmask can be removed such as by ashing or wet etching. An etch step 122 can be performed to selectively remove material 257 from the nFET S/D region. The dummy fill 257 (e.g., SiGe) can be removed using a wet etch process. In some embodiments the wet etch composition includes $H_2O_2$, $NH_4OH$ and water. In other cases, the dummy fill 257 can be removed in a gas mixture containing HCl. For example, an HCl etch can selectively remove ISBD SiGe. The Si:C layer 295 protects fins 291 in the nFET S/D region during removal of material 257. The nFET S/D 296 can be epitaxially grown in step 124 with an electron-mobility-enhancing material such as in-situ phosphorus-doped silicon (ISPD Si). Alternatively, epitaxial silicon can be grown to fill the nFET S/D followed by an implant to add dopant such as phosphorus.

As noted above, the spacer 229 in the nFET is the same as the spacer 225 in the pFET, resulting in the same offset between the epitaxial S/D and the channel for both of the pair of CMOS finFETs.

Optionally, spacer 239 can be removed such as by an aqueous solution containing a mix of hydrofluoric acid and Ethylene Glycol. Similarly, the hard mask 230 on the pFET can optionally be removed. If it is not removed, then the cap layer in the pFET includes 216 and 230, and therefore would be thicker than the cap layer in the nFET. In any event, since only one hard mask is used according to the process of the present invention, there is no residual ridge of hard mask material between the above described pair of CMOS fin-FETs.

The extensions (which includes the fin portion under the spacer and extends a certain amount from the edge of the gate towards channel) of both FETs can be activated by a single anneal (step 128). Anneal 128 can be achieved using a rapid thermal anneal tool to perform spike anneal, for example, to 1050C. Other anneal techniques include flash anneal, laser anneal, etc.

This invention is described by reference to examples but the scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal claim language.

What is claimed is:

1. A structure comprising:
    an integrated circuit substrate;
    an n-type fin set in an nFET region on the integrated circuit substrate;
    a p-type fin set in a pFET region on the integrated circuit substrate;
    a gate stack disposed over the n-type fin set and the p-type fin set;
    a gate spacer disposed over the n-type fin set and the p-type fin set and on opposite sides of the gate stack;
    a first doped epitaxial material on a source region and a drain region of the p-type fin set, wherein the source and drain regions of the p-type fin set is above the top surface of the integrated circuit substrate, and the gate spacer has a first spacer thickness between the first doped epitaxial material and the gate stack; and
    a second doped epitaxial material on a source region and a drain region of the n-type fin set, wherein the source and drain region of the n-type fin set is above the top surface of the integrated circuit substrate, the first doped epitaxial material is different than the second doped epitaxial material, the gate spacer has a second spacer thickness between the second doped epitaxial material and the gate stack, and wherein the first spacer thickness is equal to the second spacer thickness.

2. The structure of claim 1, wherein the first doped epitaxial material is a boron doped epitaxial material.

3. The structure of claim 1, wherein the second doped epitaxial material is a phosphorus doped epitaxial material.

4. The structure of claim 1, further comprising:
    a carbon doped silicon (Si:C) layer formed on at least one fin of the n-type fin set and on at least one fin of the p-type fin set.

5. The structure of claim 4, wherein the (Si:C) layer has a thickness between 1 nm and 5 nm.

6. The structure of claim 4, wherein the carbon content of the (Si:C) layer is between 2% and 2.5%.

7. An integrated circuit structure comprising:
    an n-type fin set in an nFET region on the integrated circuit substrate;
    a p-type fin set in a pFET region on the integrated circuit substrate;
    a gate stack disposed over the n-type fin set and the p-type fin set;
    a gate spacer disposed over the n-type fin set and the p-type fin set and on opposite sides of the gate stack, wherein the gate spacer has a first thickness in the pFET region and a second thickness in the nFET region, and wherein the first thickness is equal to the second thickness;
    a first doped epitaxial material on a source region and a drain region of the p-type fin set, wherein the source and drain regions of the p-type fin set is above the top surface of the integrated circuit substrate, and the gate spacer having the first thickness is between the first doped epitaxial material and the gate stack;
    a second doped epitaxial material on a source region and a drain region of the n-type fin set, the source and drain region of the n-type fin set is above the top surface of the integrated circuit substrate, the first doped epitaxial material is different than the second doped epitaxial material, the second doped epitaxial material formed by the steps of:
        forming a mask over the first doped epitaxial material and the gate spacer in the pFET region;
        removing the first doped epitaxial material from the nFET region; and
        forming the second doped epitaxial material on the source region and the drain region of the n-type fin set.

8. The structure of claim 7, wherein the first doped epitaxial material is a boron doped epitaxial material.

9. The structure of claim 7, wherein the second doped epitaxial material is a phosphorus doped epitaxial material.

10. The structure of claim 7, further comprising:
    a carbon doped silicon (Si:C) layer formed on at least one fin of the n-type fin set and on at least one fin of the p-type fin set.

11. The structure of claim 10, wherein the (Si:C) layer has a thickness between 1 nm and 5 nm.

12. The structure of claim 10, wherein the carbon content of the (Si:C) layer is between 2% and 2.5%.

* * * * *